US006930527B1

(12) United States Patent
Cabanas-Holmen et al.

(10) Patent No.: US 6,930,527 B1
(45) Date of Patent: Aug. 16, 2005

(54) TRIPLE REDUNDANT LATCH DESIGN WITH STORAGE NODE RECOVERY

(75) Inventors: Manuel Cabanas-Holmen, Longmont, CO (US); Daniel W. Krueger, Fort Collins, CO (US); Jonathan P Lotz, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 17 days.

(21) Appl. No.: 10/769,337

(22) Filed: Jan. 30, 2004

(51) Int. Cl.[7] .................. H03K 3/037; H03K 3/356
(52) U.S. Cl. .................. 327/199; 327/208; 327/218
(58) Field of Search ................ 327/199, 200, 327/201, 208–212, 218; 326/10, 11, 12; 365/156; 714/700

(56) References Cited

U.S. PATENT DOCUMENTS 6,127,864 A * 10/2000 Mavis et al. ............ 327/144
6,504,411 B2 * 1/2003 Cartagena ............... 327/199
6,667,520 B1 * 12/2003 Fulkerson ............... 257/369
6,825,691 B1 * 11/2004 Chu et al. ............... 326/46
2004/0246782 A1 * 12/2004 Chu et al. ............ 365/189.05

* cited by examiner

Primary Examiner—Tuan T. Lam
(74) Attorney, Agent, or Firm—John Pessetto

(57) ABSTRACT

In a preferred embodiment, the invention provides a circuit and method for a smaller and faster triple redundant latch with storage node recovery. An input driver is connected to the input of three transfer gates. The output of each transfer gate is connected to a separate output of one of three feedback inverters. The transfer gates are controlled by two control inputs. The inputs of the three feedback inverters are connected the output of the forward inverter/majority voter. The output from each of the three feedback inverters are inputs to the forward inverter/majority voter. The output of the forward inverter/majority voter is connected to the input of the output driver. The output of the output driver is the output of the triple redundant latch.

22 Claims, 3 Drawing Sheets

TRIPLE REDUNDANT LATCH DESIGN WITH STORAGE NODE RECOVERY

FIELD OF THE INVENTION

This invention relates generally to latch design. More particularly, this invention relates to improving soft error immunity in latches.

BACKGROUND OF THE INVENTION

High-energy neutrons lose energy in materials mainly through collisions with silicon nuclei that lead to a chain of secondary reactions. These reactions deposit a dense track of electron-hole pairs as they pass through a p-n junction. Some of the deposited charge will recombine, and some will be collected at the junction contacts. When a particle strikes a sensitive region of a latch, the charge that accumulates could exceed the minimum charge that is needed to "flip" the value stored on the latch, resulting in a soft error.

The smallest charge that results in a soft error is called the critical charge of the latch. The rate at which soft errors occur (SER) is typically expressed in terms of failures in time (FIT).

A common source of soft errors are alpha particles which may be emitted by trace amounts of radioactive isotopes present in packing materials of integrated circuits. "Bump" material used in flip-chip packaging techniques has also been identified as a possible source of alpha particles.

Other sources of soft errors include high-energy cosmic rays and solar particles. High-energy cosmic rays and solar particles react with the upper atmosphere generating high-energy protons and neutrons that shower to the earth. Neutrons can be particularly troublesome as they can penetrate most man-made construction (a neutron can easily pass through five feet of concrete). This effect varies with both latitude and altitude. In London, the effect is two times worse than on the equator. In Denver, Colo. with its mile-high altitude, the effect is three times worse than at sea-level San Francisco. In a commercial airplane, the effect can be 100–800 times worse than at sea-level.

Radiation induced soft errors are becoming one of the main contributors to failure rates in microprocessors and other complex ICs (integrated circuits). Several approaches have been suggested to reduce this type of failure. Adding ECC (Error Correction Code) or parity in data paths approaches this problem from an architectural level. Adding ECC or parity in data paths can be complex and costly.

At the circuit level, SER may be reduced by increasing the ratio of capacitance created by oxides to the capacitance created by p/n junctions. The capacitance in a latch, among other types, includes capacitance created by p/n junctions and capacitance created by oxides. Since electron/holes pairs are created as high-energy neutrons pass through a p/n junction, a reduction in the area of p/n junctions in a latch typically decreases the SER. Significant numbers of electron/hole pairs are not created when high-energy neutrons pass through oxides. As a result, the SER may typically be reduced by increasing the ratio of oxide capacitance to p/n junction capacitance in a SRAM cell.

There is a need in the art to reduce the SER in latches. An embodiment of this invention reduces the SER in latches while adding only a small increase in physical size of the latch and a small increase in the delay time through the latch. An embodiment of this invention also allows recovery of several storage nodes disturbed by a soft error event.

SUMMARY OF THE INVENTION

In a preferred embodiment, the invention provides a circuit and method for a smaller and faster triple redundant latch with storage node recovery. An input driver is connected to the input of three transfer gates. The output of each transfer gate is connected to a separate output of one of three feedback inverters. The transfer gates are controlled by two control inputs. The inputs of the three feedback inverters are connected the output of the forward inverter/majority voter. The output from each of the three feedback inverters are inputs to the forward inverter/majority voter. The output of the forward inverter/majority voter is connected to the input of the output driver. The output of the output driver is the output of the triple redundant latch.

Other aspects and advantages of the present invention will become apparent from the following detailed description, taken in conjunction with the accompanying drawings, illustrating by way of example the principles of the invention.

DETAILED DESCRIPTION OF THE PREFERRED EMBODIMENT

Figure 1:
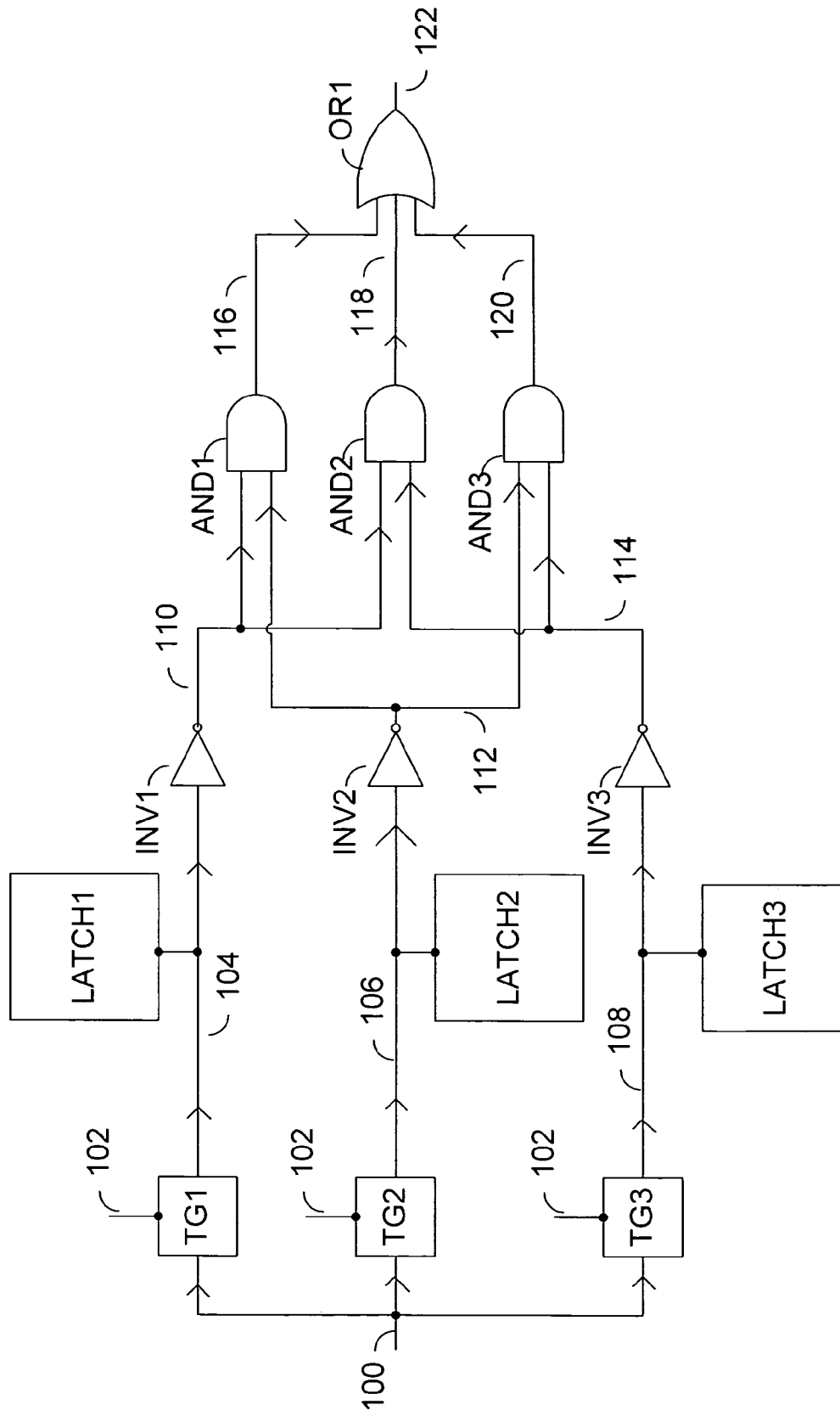
FIG. 1 is a schematic of a triple redundant latch. Prior Art

FIG. 1 is a schematic of a triple redundant latch. The input, 100, to the triple redundant latch is connected to the input of transfer gates, TG1, TG2, and TG3. Control signal, 102, is connected to transfer gates, TG1, TG2, and TG3. Control signal, 102, controls when the signal on the input of transfer gates, TG1, TG2, and TG3 is transferred to the outputs, 104, 106, and 108 of transfer gates, TG1, TG2, and TG3 respectively. The signal presented to outputs, 104, 106, and 108, is stored in LATCH1, LATCH2, and LATCH3 respectively.

After control signal, 102, is turned off, the signal on LATCH1 drives the input of inverter, INV1. After control signal, 102, is turned off, the signal on LATCH2 drives the input of inverter, INV2. After control signal, 102, is turned off, the signal on LATCH3 drives the input of inverter, INV3. The output, 110, of inverter, INV1, drives an input to AND1 and an input to AND2. The output, 112, of inverter, INV2, drives an input to AND1 and an input to AND3. The output, 114, of inverter, INV3, drives an input to AND2 and an input to AND3. The output, 116, of AND1 drives an input of OR1. The output, 118, of AND2 drives an input of OR1. The output, 120, of AND3 drives an input of OR1. The output of the triple redundant latch is the output, 122 of OR1.

A triple redundant latch reduces soft errors by storing the same data in three different latches. For example, when the control signal, 102 is on, a logical high value may be driven from the inputs, 100, of transfer gates, TG1, TG2, and TG3 to the outputs, 104, 106, and 108, of transfer gates, TG1, TG2, and TG3 respectively. After turning control signal 102 off, a logical high value is stored in latches, LATCH1, LATCH2, and LATCH3. The stored logical high value on LATCH1 drives the input of inverter, INV1, and produces a logical low value on the output, 110, of inverter, INV1. The stored logical high value on LATCH2 drives the input of inverter, INV2, and produces a logical low value on the output, 112, of inverter, INV2. The stored logical high value on LATCH3 drives the input of inverter, INV3, and produces a logical low value on the output, 114, of inverter, INV3.

Since the output, 110, 112, and 114 of inverters, INV1, INV2, and INV3, respectively, are low, all the inputs, 110, 112, and 114 to AND1, AND2, and AND3 respectively are a logical low value. Since all the inputs, 110, 112, and 114, to AND1, AND2, and AND3 respectively are a logical low value, the output, 116, 118, and 120 of AND1, AND2, and AND3 respectively are a logical low value. Since the output, 116, 118, and 120 of AND1, AND2, and AND3, respectively are a logical low value, all the inputs of OR1 are a logical low value. Since all the inputs, 116, 118, and 120 to OR1 are logical low value, the output, 122, is logical low value.

If a soft error occurs, for example, in LATCH2, and changes the stored logical value from a logical high value to a logical low value, a logical low value is now presented to the input, 106, of inverter, INV2. The output, 112, of inverter, INV2, presents a logical high value to an input of AND1 and AND3. Since, in this example, the other input, 110 to AND1 and the other input, 114, to AND3, is a logical low value, the output, 116 and 120 of AND1 and AND3 respectively remains a logical low value and the output, 122, does not change. This example illustrates how a single soft error in one latch does not change the original stored value in a triple redundant latch.

As a further example, assume, in addition to the soft error in LATCH2, there is an additional soft error in LATCH3. Now, the input, 108, to inverter, INV3, is a logical low value and as a result, the output, 114, of inverter, INV3, is a logical high value. A logical high value in now presented to an input, 114, of AND2, and to an input, 114, of AND3. Since a logical low and logical high valued are presented on the inputs of AND1, the output, 116 of AND1 is still a logical low value. Since a logical low and logical high valued are presented on the inputs of AND2, the output, 118 of AND2 is still a logical low value. However, since inputs, 112 and 114, to AND3 are a logical high value, the output, 120, is a logical high value. Since input, 120, to OR1 is a logical high value, the output, 122, changes from a logical low value to a logical high value. This example illustrates how soft errors in two latches of a triple redundant latch does change the original stored value of the triple redundant latch.

A triple redundant latch prevents a single soft error from changing the original value stored in the latch. However, this comes at the cost of additional circuitry which results in a physically larger latch. In addition, a triple redundant may introduce time delay in the delay path of the latch. As consequence, a triple redundant latch is usually larger and slower than a single latch.

Figure 2:
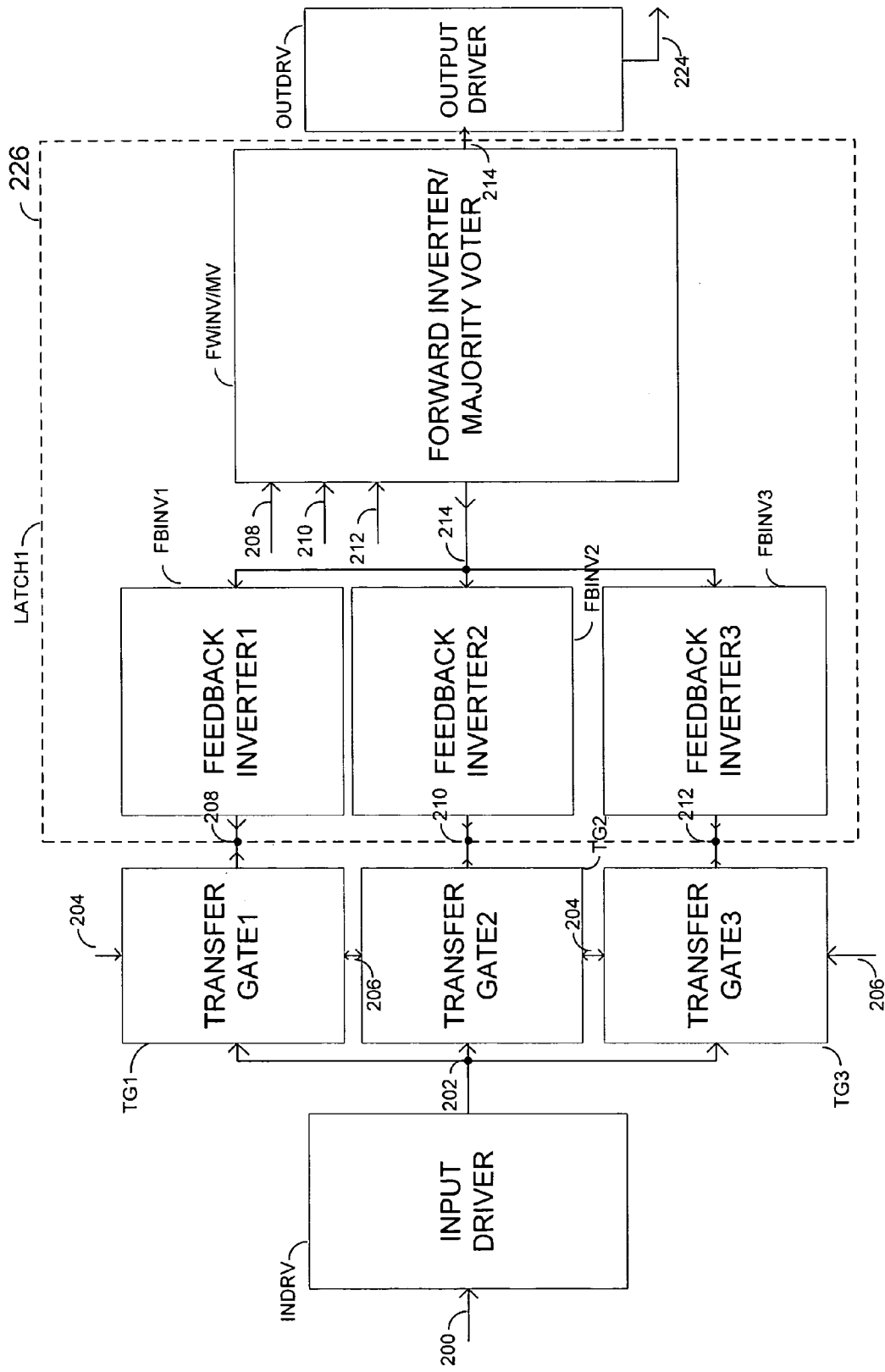
FIG. 2 is a block diagram of an improved triple redundant latch with storage node recovery.

FIG. 2 is a block diagram of a triple redundant latch with storage node recovery. An input driver, INDRV, receives a signal at its input, 200, and drives a signal from its output, 202, to the inputs, 202, of transfer gates, TG1, TG2, and TG3. In addition, a tristatable input inverter, a cross-coupled NAND gate, and a cross-coupled NOR gate may used in place of a transfer gate. If the control signals, 204 and 206, are on, the signal at the input, 202, of transfer gates, TG1, TG2, and TG3, is transferred to the output, 208, of transfer gate, TG1, the output, 210, of transfer gate, TG2, and the output, 212 of transfer gate, TG3. The logical value presented on storage nodes, 208, 210, and 212 are also presented as inputs to the forward inverter/majority voter, FWINV/MV.

The forward inverter/majority voter, FWINV/MV, as a result of the logical value presented on inputs 208, 210, and 212, outputs a logical value, 214, of the opposite sense of the logical value presented on the inputs, 208, 210, and 212. The output, 214, of the forward inverter/majority voter, FWINV/MV, drives the input of each feedback inverter, FBINV1, FBINV2, and FBINV3. In addition, a tristatable inverter may be used in place of a feedback inverter. The output of each feedback inverter, 208, 210, and 212, feeds back the same logical value originally presented at the outputs, 208, 210, and 212, of transfer gates TG1, TG2, and TG3 respectively. The combination of feedback inverters, FBINV1, FBINV2, and FBINV3 along with the forward inverter/majority voter, FWINV/MV, create a latch, 226, where nodes 208, 210, and 212 are storage nodes.

After control inputs, 204 and 206, are turned off, the latch, 226, retains the original signal logical value presented by transfer gates, TG1, TG2, and TG3. The logical value stored on storage nodes 208, 210, and 212 are connected to the inputs of the forward inverter/majority voter, FWINV/MV. The output, 214, of the forward inverter/majority voter, FWINV/MV, drives the input, 214, of the output driver, OUTDRV. The output, 224, of the output driver, OUTDRV, is the output of the triple redundant latch.

As an example of how redundancy applies for this embodiment, assume that a logical high value is stored. Storage nodes 208, 210, and 212 each have a logical high value stored in this example. Storage node 214 holds a logical low value. If, in this example, storage node 208 is disturbed by a soft error event and the value on node 208 changes to a logical low value, a logical low value is presented to an input of the forward inverter/majority voter, FWINV/MV. Since the forward inverter/majority inverter, FWINV/MV, still has two inputs, 210 and 212, at a logical high value, the output of the forward inverter/majority inverter, FWINV/MV, remains a logical low value as it was before the soft error event. Since node 214 remains a logical low value, the input of feedback inverter, FBINV1, is driven by a logical low value. Since the input, 214, of feedback inverter, FBINV1, is driven by a logical low value, the output, 208, of the feedback inverter, FBINV1, is driven back to its original logical high value. The storage node, 208, is recovered.

If, however, in this example, a soft error event changes the values stored on nodes 208 and 210 at nearly the same time, the triple redundant latch will change from its original value. If a soft error event, at nearly the same time, changes the logical values stored on nodes 208 and 210, from a logical high values to a logical low values, the inputs, 208 and 210, into the forward inverter/majority voter, FWINV/MV, change from logical high values to logical low values. As a result of having logical low values on the inputs, 208 and 210, the majority vote is a logical low value. As a result, the logical value stored on node 214 is changed from the original logical low value to a logical high value. Since the logical value stored on node 214 is high, the input to all three feedback inverters, FBINV1, FBINV2, and FBINV3, is a logical high value. Because the input to all three feedback inverters, FBINV1, FBINV2, and FBINV3, is a logical high value, the output, 208, 210, and 212 of the feedback inverters, FBINV1, FBINV2, and FBINV3 respectively, are driven to a logical low value. In this example, the original value stored in the triple redundant latch is changed from a logical high value to a logical low value.

In addition to improving the soft error rate of a latch, the triple redundant latch shown in FIG. 2, also reduces the physical size of a triple redundant latch because it uses fewer transistors. The triple redundant latch shown in FIG. 2 also reduces the delay time through a triple redundant latch because the number of logic delays is reduced.

Figure 3:
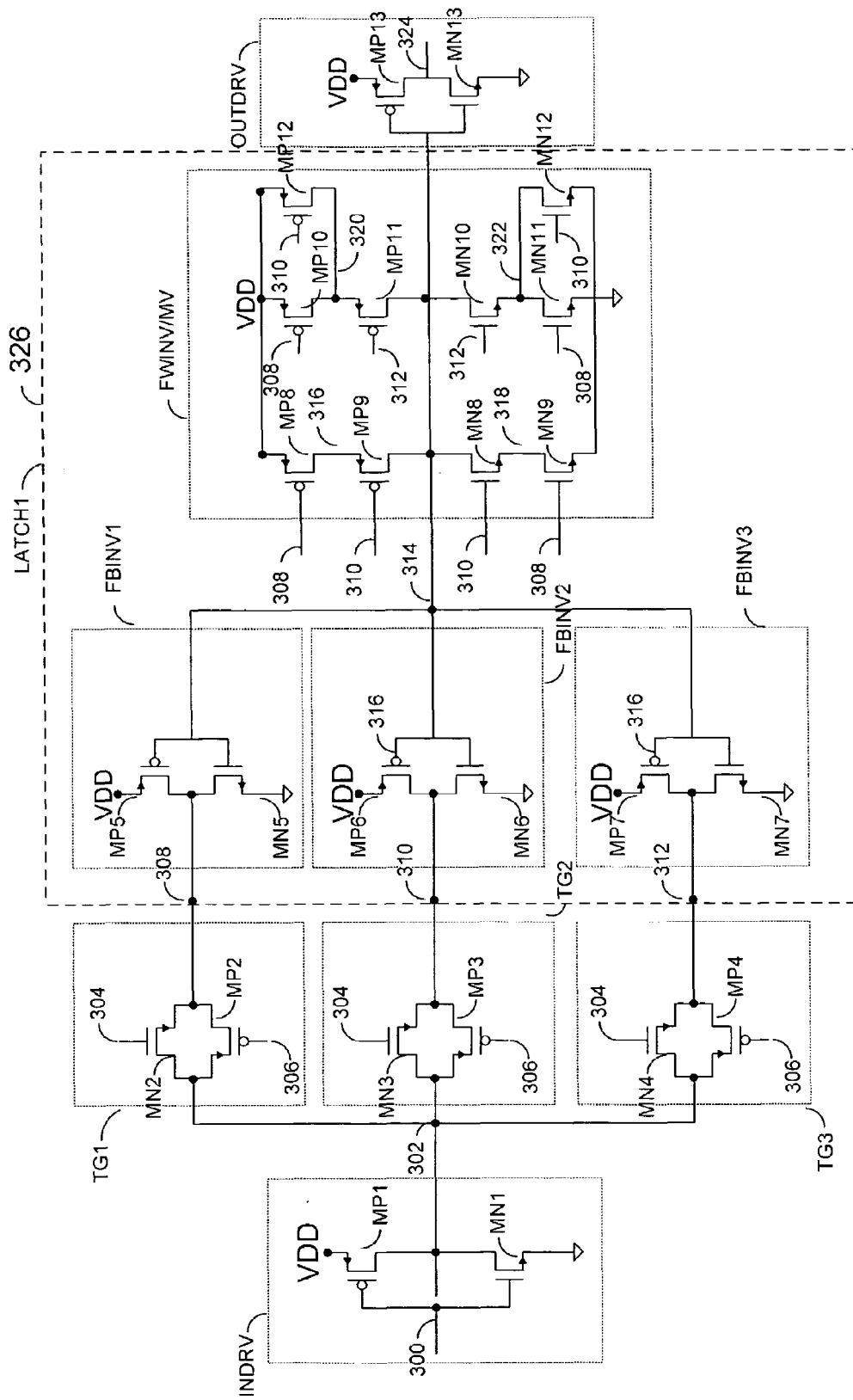
FIG. 3 is a schematic of an improved triple redundant latch with storage node recovery.

FIG. 3 is a schematic of an improved triple redundant latch with storage node recovery. FIG. 3 contains the same basic blocks that FIG. 2 contains; input driver, INDRV, transfer gate 1, TG1, transfer gate 2, TG2, transfer gate 3, TG3, feedback inverter, FBINV1, feedback inverter, FBINV2, feedback inverter, FBINV3, forward inverter/majority voter, FWINV/MV, and output driver, OUTDRV. An embodiment of an input driver, INDRV, for the triple redundant latch contains a PFET, MP1 and an NFET, MN1. In this embodiment, the source of the PFET, MP1 is connected to VDD, the drain, 302, is connected to the output of the input driver, INDRV, and the drain of the NFET, MN1. The gates, 300, of the PFET, MP1, and the NFET, MN1, are connected to the input of the input driver, INDRV. The source of the NFET, MN1, is connected to GND.

An embodiment of a transfer gate 1, TG1, for the triple redundant latch contains a PFET, MP2 and an NFET MN2. In this embodiment, the drains of PFET, MP2, and NFET, MN2, are connected to the input, 302, of transfer gate 1, TG1. The sources of PFET, MP2, and NFET, MN2, are connected to the output, 308, of transfer gate 1, TG1. The gate of PFET, MP2, is connected to the control input, 306, of transfer gate 1, TG1. The gate of NFET, MN2, is connected to the control input, 304, of transfer gate 1, TG1.

An embodiment of a transfer gate 2, TG2, for the triple redundant latch contains a PFET, MP3 and an NFET MN3. In this embodiment, the drains of PFET, MP3, and NFET, MN3, are connected to the input, 302, of transfer gate 2, TG2. The sources of PFET, MP3, and NFET, MN3, are connected to the output, 310, of transfer gate 2, TG2. The gate of PFET, MP3, is connected to the control input, 306, of transfer gate 2, TG2. The gate of NFET, MN3, is connected to the control input, 304, of transfer gate 2, TG2.

An embodiment of a transfer gate 3, TG3, for the triple redundant latch contains a PFET, MP4 and an NFET MN4. In this embodiment, the drains of PFET, MP4, and NFET, MN4, are connected to the input, 302, of transfer gate 3, TG3. The sources of PFET, MP4, and NFET, MN4, are connected to the output, 312, of transfer gate 3, TG3. The gate of PFET, MP4, is connected to the control input, 306, of transfer gate 3, TG3. The gate of NFET, MN4, is connected to the control input, 304, of transfer gate 3, TG3.

An embodiment of feedback inverter 1, FBINV1, for the triple redundant latch contains PFET, MP5, and NFET, MN5. In this embodiment, the gate of PFET, MP5, and the gate of NFET, MN5, is connected to input, 314, of feedback inverter 1, FBINV1. The drain of PFET, MP5, and the drain of NFET, MN5, is connected to the output, 308, of feedback inverter 1, FBINV1. The source of PFET, MP5 is connected to VDD. The source of NFET, MN5, is connected to GND.

An embodiment of feedback inverter 2, FBINV2, for the triple redundant latch contains PFET, MP6, and NFET, MN6. In this embodiment, the gate of PFET, MP6, and the gate of NFET, MN6, is connected to input, 314, of feedback inverter 2, FBINV2. The drain of PFET, MP6, and the drain of NFET, MN6, is connected to the output, 310, of feedback inverter 2, FBINV2. The source of PFET, MP6 is connected to VDD. The source of NFET, MN6, is connected to GND.

An embodiment of feedback inverter 3, FBINV3, for the triple redundant latch contains PFET, MP7, and NFET, MN7. In this embodiment, the gate of PFET, MP7, and the gate of NFET, MN7, is connected to input, 314, of feedback inverter 3, FBINV3. The drain of PFET, MP7, and the drain of NFET, MN7, is connected to the output, 312, of feedback inverter 3, FBINV3. The source of PFET, MP7 is connected to VDD. The source of NFET, MN7, is connected to GND.

An embodiment of a forward inverter/majority voter, FWINV/MV, for the triple redundant latch contains PFET, MP8, PFET, MP9, PFET, MP10, PFET, MP11, PFET, MP12, NFET, MN8, NFET, MN9, NFET, MN10, NFET, MN11, and NFET, MN12. In this embodiment, the sources of PFET, MP8, PFET, MP10, and PFET, MP12, are connected to VDD. In this embodiment, the sources of NFET, MN9, NFET, MN11, and NFET, MN12, are connected to GND. The drain of PFET, MP8, and the source of PFET, MP9 are connected to node, 316. The drain of PFET, MP10, the drain of PFET, MP12, and the source of PFET, MP11 are connected to node, 320. The drain of NFET, MN9, and the source of NFET, MN8 are connected to node, 318. The drain of NFET, MN11, the drain of NFET, MN12, and the source of NFET, MN10 are connected to node 322. The drains of PFET, MP9, PFET, MP11, NFET, MN8, and NFET, MN10 are connected to the output, 314, of the forward inverter/majority voter, FWINV/MV. The gates of PFET, MP8, PFET, MP10, NFET, MN9, and NFET, MN11, are connected to an input, 308, of the forward inverter/majority voter, FWINV/MV. The gates of PFET, MP9, PFET, MP12, NFET, MN8, and NFET, MN12, are connected to an input, 310, of the forward inverter/majority voter, FWINV/MV. The gates of PFET, MP11, and NFET, MN10, are connected to an input, 312, of the forward inverter/majority voter, FWINV/MV.

An embodiment of an output driver, OUTDRV, for the triple redundant latch contains a PFET, MP13 and an NFET, MN13. In this embodiment, the source of the PFET, MP13 is connected to VDD, the drain, 324, is connected to the output of the output driver, OUTDRV, and the drain of the NFET, MN13. The gates, 314, of the PFET, MP13, and the NFET, MN13, are connected to the input, 314, of the input driver, OUTDRV. The source of the NFET, MN13, is connected to GND.

FIG. 3 is a schematic of an improved triple redundant latch. An input driver, INDRV, receives a signal at its input, 300, and drives a signal from its output, 302, to the inputs, 302, of transfer gate 1, TG1, transfer gate 2, TG2, and transfer gate 3, TG3. If control signal, 304 is a logical high value and control signal, 306, is a logical low value, the signal at the input, 302, of transfer gate 1, TG1, transfer gate 2, TG2, and transfer gate 3, TG3 is transferred to the output, 308, of transfer gate 1, TG1, the output, 310, of transfer gate 2, TG2, and the output, 312, of transfer gate 3, TG3.

The signal transferred to nodes 308, 310, and 312 is also present on the inputs of the forward inverter/majority voter, FWINV/MV. Since the inputs, 308, 310, and 312 are the same sense, the opposite sense is presented on the output, 314, of the forward inverter/majority voter, FWINV/MV. The output of the forward inverter/majority voter, FWINV/MV, is presented on the input, 314, of all three feedback inverters, FBINV1, FBINV2, and FBINV3. The outputs, 308, 310, and 312, of the feedback inverters, FBINV1, FBINV2, and FBINV3 respectively reinforce the original logical value stored on nodes 308, 310, and 312. The combination of feedback inverters, FBINV1, FBINV2, FBINV3, and forward inverter/majority voter, FWINV/MV, form a latch, LATCH1, 326.

After control input, 304, is driven to a logical low value, and control input, 306, is driven to a logical high value, LATCH1, 326, stores the original logical value stored on nodes 308, 310, and 312. The original logical value stored on nodes 308, 310 and 312, are applied to the inputs, 308, 310, and 312 of the forward inverter/majority voter, FWINV/MV.

If none of the nodes, 308, 310, and 312, is disturbed, then a signal of the opposite sense is presented on the output, 314, of the forward inverter/majority voter, FWINV/MV.

For example, if a logical high value is stored on nodes 308, 310, and 312, then a logical low value is presented on the output, 314, of the forward inverter/majority voter, FWINV/MV. The logical low value on the output, 314, of the forward inverter/majority voter, FWINV/MV, is then presented on the inputs, 314, of each feedback inverter, FBINV1, FBINV2, and FBINV3. In this example, the outputs, 308, 310, and 312, of feedback inverters, FBINV1, FBINV2, and FBINV3, respectively, reinforce the original logical high value stored on nodes 308, 310, and 312. In this example, the logical low value presented to input, 314, of the output driver, OUTDRV, is driven to a logical high value at the output, 324, of the output driver, OUTDRV.

If in this example where a logical high value is stored on nodes, 308, 310, and 312, node 308 is changed to a logical low value by a soft error event, a logical low value is then presented to input, 308, of the forward inverter/majority voter, FWINV/MV. Inputs, 310 and 312, remain a logical high value. Since inputs, 310 and 312, are logical high values and the majority, the output, 314, of the forward inverter/majority voter, FWINV/MV remains a logical low value. Because the output, 314, of the forward inverter/majority voter, FWINV/MV, is a logical low value, the output, 308, of feedback inverter, FBINV1, is driven to a logical high value. The logical value on node 308 is recovered from the disturbed value of a logical low value to the original logical high valued stored on it. In this example, a single soft error did not change the original value stored in the triple redundant latch.

If, however, a soft error event changes the value stored on node, 308 and node, 310, at nearly the same time, the triple redundant latch will change from its original value. For example, if a logical high value is stored on nodes 308, 310, and 312, a logical low value is presented on the output, 314, of the forward inverter/majority voter, FWINV/MV. If a soft error event changes the logical value stored on nodes, 308 and 310, from a logical high value to a logical low value at nearly the same time, inputs, 308 and 310, into the forward inverter/majority voter, FWINV/MV, change from logical high values to logical low values. Since inputs, 308 and 310, of the forward inverter/majority voter, FWINV/MV, are a logical low value, the majority vote is low and the output, 314, of the forward inverter/majority voter, FWINV/MV, is a logical high value. Since the output, 314, is a logical high value, the values stored on nodes 308, 310, and 312 are changed to a logical low value. In this example, the original value stored in the triple redundant latch is changed from a logical high value to a logical low value.

If two soft error events occur far enough apart in time, nodes 308, 310, and 312 will all retain their original logical values. For example, if a soft error event changes node 308 from a logical high value to a logical low value, and a second soft error event doesn't disturb node 310 until the triple redundant latch recovers node 308, the node, 310, disturbed by a second soft error event will also be recovered to a high logical value. In this example, all nodes, 308, 310, and 312 will retain their original logical high value after these two soft error events. An advantage of this latch is that the value stored may be held for years without being disturbed. For example, a gated latched may store a value during power up of a system. This value may not change until the system is powered down again. In some cases, a system may not be powered down for years and a latch may not be refreshed during this time.

The soft error rate for this triple redundant latch is lower when implemented using CMOS (Complementary Metal Oxide Semiconductor) on a SOI (Silicon On Insulator) substrate than when implemented using CMOS on semiconductor substrate. Because the failure mechanism for CMOS on a SOI is different from the failure mechanism for CMOS on a semiconductor substrate when using this triple redundant latch, a lower soft error rate may be achieved when designing this triple redundant latch using CMOS on SOI. The failure mechanism for the triple redundant latch when using CMOS on a semiconductor substrate is a storage node effect. Electron-hole pairs may create charge that can diffuse to a storage node and change the logical value on the node. The failure mechanism for a triple redundant latch when using CMOS on SOI is a transistor effect. When radiation strikes one or more transistors in the latch, one or more bipolar transistors may be triggered with enough gain to turn one or more FETs on. If enough FETs are turned on the storage node, 314, shown in FIG. 3 may change it's logical value.

In addition to improving the soft error rate of a latch, the triple redundant latch shown in FIG. 3, also reduces the physical size of a triple redundant latch because it uses fewer transistors. The triple redundant latch shown in FIG. 3 also reduces the delay time through a triple redundant latch because the number of logic delays is reduced.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A triple redundant latch for reducing soft errors comprising:
   a) an input driver, the input driver having an input and an output;
   b) a first transfer gate, the first transfer gate having an input, a first control input, a second control input and an output;
   c) a second transfer gate, the second transfer gate having an input, a first control input, a second control input, and an output;
   d) a third transfer gate, the transfer third gate having an input, a first control input, a second control input, and an output;
   e) a first feedback inverter, the first feedback inverter having an input and an output;
   f) a second feedback inverter, the second feedback inverter having an input and an output;
   g) a third feedback inverter, the third feedback inverter having an input and an output;
   h) a forward inverter/majority voter, the forward inverter/majority voter having a first input, a second input, a third input and an output;
   i) an output driver, the output driver having an input and an output;
   j) wherein the input of the input driver is the input of the triple redundant latch;

k) wherein the output of the input driver is connected to the input of the first transfer gate, the input of the second transfer gate, and the input of the third transfer gate;

l) wherein a first control input of the triple redundant latch is connected to the first control input of the first transfer gate, the first control input of the second transfer gate, and the first control input of the third transfer gate;

m) wherein a second control input of the triple redundant latch is connected to the second control input of the first transfer gate, the second control input of the second transfer gate, and the second control input of the third transfer gate;

n) wherein the output of the first transfer gate is connected to the output of the first feedback inverter and to the first input of the forward inverter/majority voter;

o) wherein the output of the second transfer gate is connected to the output of the second feedback inverter and to the second input of the forward inverter/majority voter;

p) wherein the output of the third transfer gate is connected to the output of the third feedback inverter and to the third input of the forward inverter/majority voter;

q) wherein the output of the forward inverter/majority voter is connected to the input of the first feedback inverter, the input of the second feedback inverter, the input of the third feedback inverter, and to the input of the output driver;

r) wherein the output of the output driver is the output of the triple redundant latch.

2. The triple redundant latch as in claim 1 wherein input driver comprises:
 a) a PFET, the PFET having a gate, a drain and a source;
 b) a NFET, the NFET having a gate, a drain and a source;
 c) wherein the source of the PFET is connected to VDD;
 d) wherein the source of the NFET is connected to GND;
 e) wherein the gates of the NFET and the PFET are the input of the input driver;
 f) wherein the drains of the NFET and the PFET are the output of the input driver.

3. The triple redundant latch as in claim 1 wherein the first transfer gate comprises:
 a) a PFET, the PFET having a gate, a drain and a source;
 b) a NFET, the NFET having a gate, a drain and a source;
 c) wherein the drains of the PFET and the NFET are connected to the input of the first transfer gate;
 d) wherein the sources of the PFET and the NFET are connected to the output of the first transfer gate;
 e) wherein the gate of the NFET is connected to the first control input of the first transfer gate;
 f) wherein the gate of the PFET is connected to the second control input of the first transfer gate.

4. The triple redundant latch as in claim 1 wherein the second transfer gate comprises:
 a) a PFET, the PFET having a gate, a drain and a source;
 b) a NFET, the NFET having a gate, a drain and a source;
 c) wherein the drains of the PFET and the NFET are connected to the input of the second transfer gate;
 d) wherein the sources of the PFET and the NFET are connected to the output of the second transfer gate;
 e) wherein the gate of the NFET is connected to the first control input of the second transfer gate;
 f) wherein the gate of the PFET is connected to the second control input of the second transfer gate.

5. The triple redundant latch as in claim 1 wherein the third transfer gate comprises:
 a) a PFET, the PFET having a gate, a drain and a source;
 b) a NFET, the NFET having a gate, a drain and a source;
 c) wherein the drains of the PFET and the NFET are connected to the input of the third transfer gate;
 d) wherein the sources of the PFET and the NFET are connected to the output of the third transfer gate;
 e) wherein the gate of the NFET is connected to the first control input of the third transfer gate;
 f) wherein the gate of the PFET is connected to the second control input of the third transfer gate.

6. The triple redundant latch as in claim 1 wherein the first feedback inverter comprises:
 a) a PFET, the PFET having a gate, a drain and a source;
 b) a NFET, the NFET having a gate, a drain and a source;
 c) wherein the source of the PFET is connected to VDD;
 d) wherein the source of the NFET is connected to GND;
 e) wherein the gate of the NFET and the gate of the PFET are the input of the first feedback inverter;
 f) wherein the drain of the NFET and the drain of the PFET are the output of the first feedback inverter.

7. The triple redundant latch as in claim 1 wherein the second feedback inverter comprises:
 a) a PFET, the PFET having a gate, a drain and a source;
 b) a NFET, the NFET having a gate, a drain and a source;
 c) wherein the source of the PFET is connected to VDD;
 d) wherein the source of the NFET is connected to GND;
 e) wherein the gate of the NFET and the gate of the PFET are the input of the second feedback inverter;
 f) wherein the drain of the NFET and the drain of the PFET are the output of the second feedback inverter.

8. The triple redundant latch as in claim 1 wherein the third feedback inverter comprises:
 a) a PFET, the PFET having a gate, a drain and a source;
 b) a NFET, the NFET having a gate, a drain and a source;
 c) wherein the source of the PFET is connected to VDD;
 d) wherein the source of the NFET is connected to GND;
 e) wherein the gate of the NFET and the gate of the PFET are the input of the third feedback inverter;
 f) wherein the drain of the NFET and the drain of the PFET are the output of the third feedback inverter.

9. The triple redundant latch as in claim 1 wherein the forward inverter/majority voter comprises:
 a) a first PFET, the first PFET having a gate, a drain and a source;
 b) a second PFET, the second PFET having a gate, a drain and a source;
 c) a third PFET, the third PFET having a gate, a drain and a source;
 d) a fourth PFET, the fourth PFET having a gate, a drain and a source;
 e) a fifth PFET, the fifth PFET having a gate, a drain and a source;
 f) a first NFET, the first NFET having a gate, a drain and a source;
 g) a second NFET, the second NFET having a gate, a drain and a source;
 h) a third NFET, the third NFET having a gate, a drain and a source;
 i) a fourth NFET, the fourth NFET having a gate, a drain and a source;
 j) a fifth NFET, the fifth NFET having a gate, a drain and a source;
 k) wherein the sources of the first, second, and third PFETs are connected to VDD;

l) wherein the sources of the first, second, and third NFETs are connected to GND;
m) wherein the drains of the fourth PFET, the fifth PFET, the fourth NFET, and the fifth NFET are connected to the output of the forward inverter/majority voter;
n) wherein the gates of the first PFET, the second PFET, the first NFET, and the second NFET are connected to the output of the first feedback inverter;
o) wherein the gates of the third PFET, the fourth PFET, the third NFET, and the fourth NFET are connected to the output of the second feedback inverter;
p) wherein the gates of the fifth PFET and the fifth NFET are connected to the output of the third feedback inverter;
q) wherein the drain of the first PFET is connected to the source of the fourth PFET;
r) wherein the drain of the second PFET and the drain of the third PFET are connected to the source of the fifth PFET;
s) wherein the drain of the first NFET is connected to the source of the fourth NFET;
t) wherein the drain of the second NFET and the drain of the third NFET are connected to the source of the fifth PFET.

10. The triple redundant latch as in claim 1 wherein the output driver comprises:
a) a PFET, the PFET having a gate, a drain and a source;
b) a NFET, the NFET having a gate, a drain and a source;
c) wherein the source of the PFET is connected to VDD;
d) wherein the source of the NFET is connected to GND;
e) wherein the gates of the NFET and the PFET are the input of the output driver;
f) wherein the drains of the NFET and the PFET are the output of the output driver.

11. A method of manufacturing a triple redundant latch with improved soft error rate comprising:
a) fabricating an input driver, the input driver having an input and an output;
b) fabricating a first transfer gate, the first transfer gate having an input, a first control input, a second control input and an output;
c) fabricating a second transfer gate, the second transfer gate having an input, a first control input, a second control input, and an output;
d) fabricating a third transfer gate, the third transfer gate having an input, a first control input, a second control input, and an output;
e) fabricating a first feedback inverter, the first feedback inverter having an input and an output;
f) fabricating a second feedback inverter, the second feedback inverter having an input and an output;
g) fabricating a third feedback inverter, the third feedback inverter having an input and an output;
h) fabricating a forward inverter/majority voter, the forward inverter/majority voter having a first input, a second input, a third input and an output;
i) fabricating an output driver, the output driver having an input and an output;
j) wherein the input of the input driver is the input of the triple redundant latch;
k) wherein the output of the input driver is connected to the input of the first transfer gate, the input of the second transfer gate, and the input of the third transfer gate;
l) wherein a first control input of the triple redundant latch is connected to the first control input of the first transfer gate, the first control input of the second transfer gate, and the first control input of the third transfer gate;
m) wherein a second control input of the triple redundant latch is connected to the second control input of the first transfer gate, the second control input of the second transfer gate, and the second control input of the third transfer gate;
n) wherein the output of the first transfer gate is connected to the output of the first feedback inverter and to the first input of the forward inverter/majority voter;
o) wherein the output of the second transfer gate is connected to the output of the second feedback inverter and to the second input of the forward inverter/majority voter;
p) wherein the output of the third transfer gate is connected to the output of the third feedback inverter and to the third input of the forward inverter/majority voter;
q) wherein the output of the forward inverter/majority voter is connected to the input of the first feedback inverter, the input of the second feedback inverter, the input of the third feedback inverter, and to the input of the output driver;
r) wherein the output of the output driver is the output of the triple redundant latch.

12. The method of manufacturing a triple redundant latch as in claim 11 wherein the input driver comprises:
a) a PFET, the PFET having a gate, a drain and a source;
b) a NFET, the NFET having a gate, a drain and a source;
c) wherein the source of the PFET is connected to VDD;
d) wherein the source of the NFET is connected to GND;
e) wherein the gates of the NFET and the PFET are the input of the input driver;
f) wherein the drains of the NFET and the PFET are the output of the input driver.

13. The method of manufacturing a triple redundant latch as in claim 11 wherein the first transfer gate comprises:
a) a PFET, the PFET having a gate, a drain and a source;
b) a NFET, the NFET having a gate, a drain and a source;
c) wherein the drains of the PFET and the NFET are connected to the input of the first transfer gate;
d) wherein the sources of the PFET and the NFET are connected to the output of the first transfer gate;
e) wherein the gate of the NFET is connected to the first control input of the first transfer gate;
f) wherein the gate of the PFET is connected to the second control input of the first transfer gate.

14. The method of manufacturing a triple redundant latch as in claim 11 wherein the second transfer gate comprises:
a) a PFET, the PFET having a gate, a drain and a source;
b) a NFET, the NFET having a gate, a drain and a source;
c) wherein the drains of the PFET and the NFET are connected to the input of the second transfer gate;
d) wherein the sources of the PFET and the NFET are connected to the output of the second transfer gate;
e) wherein the gate of the NFET is connected to the first control input of the second transfer gate;
f) wherein the gate of the PFET is connected to the second control input of the second transfer gate.

15. The method of manufacturing a triple redundant latch as in claim 11 wherein the third transfer gate comprises:
a) a PFET, the PFET having a gate, a drain and a source;
b) a NFET, the NFET having a gate, a drain and a source;
c) wherein the drains of the PFET and the NFET are connected to the input of the third transfer gate;
d) wherein the sources of the PFET and the NFET are connected to the output of the third transfer gate;

e) wherein the gate of the NFET is connected to the first control input of the third transfer gate;

f) wherein the gate of the PFET is connected to the second control input of the third transfer gate.

16. The method of manufacturing a triple redundant latch as in claim 11 wherein the first feedback inverter comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gate of the NFET and the gate of the PFET are the input of the first feedback inverter;
   f) wherein the drain of the NFET and the drain of the PFET are the output of the first feedback inverter.

17. The method of manufacturing a triple redundant latch as in claim 11 wherein the second feedback inverter comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gate of the NFET and the gate of the PFET are the input of the second feedback inverter;
   f) wherein the drain of the NFET and the drain of the PFET are the output of the second feedback inverter.

18. The method of manufacturing a triple redundant latch as in claim 11 wherein the third feedback inverter comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gate of the NFET and the gate of the PFET are the input of the third feedback inverter;
   f) wherein the drain of the NFET and the drain of the PFET are the output of the third feedback inverter.

19. The method of manufacturing a triple redundant latch as in claim 11 wherein the forward inverter/majority voter comprises:
   a) a first PFET, the first PFET having a gate, a drain and a source;
   b) a second PFET, the second PFET having a gate, a drain and a source;
   c) a third PFET, the third PFET having a gate, a drain and a source;
   d) a fourth PFET, the fourth PFET having a gate, a drain and a source;
   e) a fifth PFET, the fifth PFET having a gate, a drain and a source;
   f) a first NFET, the first NFET having a gate, a drain and a source;
   g) a second NFET, the second NFET having a gate, a drain and a source;
   h) a third NFET, the third NFET having a gate, a drain and a source;
   i) a fourth NFET, the fourth NFET having a gate, a drain and a source;
   j) a fifth NFET, the fifth NFET having a gate, a drain and a source;
   k) wherein the sources of the first, second, and third PFETs are connected to VDD;
   l) wherein the sources of the first, second, and third NFETs are connected to GND;
   m) wherein the drains of the fourth PFET, the fifth PFET, the fourth NFET, and the fifth NFET are connected to the output of the forward inverter/majority voter;
   n) wherein the gates of the first PFET, the second PFET, the first NFET, and the second NFET are connected to the output of the first feedback inverter;
   o) wherein the gates of the third PFET, the fourth PFET, the third NFET, and the fourth NFET are connected to the output of the second feedback inverter;
   p) wherein the gates of the fifth PFET and the fifth NFET are connected to the output of the third feedback inverter;
   q) wherein the drain of the first PFET is connected to the source of the fourth PFET;
   r) wherein the drain of the second PFET and the drain of the third PFET are connected to the source of the fifth PFET;
   s) wherein the drain of the first NFET is connected to the source of the fourth NFET;
   t) wherein the drain of the second NFET and the drain of the third NFET are connected to the source of the fifth PFET.

20. The method of manufacturing a triple redundant latch as in claim 11 wherein the output driver comprises:
   a) a PFET, the PFET having a gate, a drain and a source;
   b) a NFET, the NFET having a gate, a drain and a source;
   c) wherein the source of the PFET is connected to VDD;
   d) wherein the source of the NFET is connected to GND;
   e) wherein the gates of the NFET and the PFET are the input of the first output driver;
   f) wherein the drains of the NFET and the PFET are the output of the first output driver.

21. The method of manufacturing a triple redundant latch as in claim 11 wherein the triple redundant latch is manufactured in CMOS on a semiconductor substrate.

22. The method of manufacturing a triple redundant latch as in claim 11 wherein the triple redundant latch is manufactured in CMOS on SOI.

* * * * *

UNITED STATES PATENT AND TRADEMARK OFFICE
CERTIFICATE OF CORRECTION

| | | |
|---|---|---|
| PATENT NO. | : 6,930,527 B1 | Page 1 of 1 |
| APPLICATION NO. | : 10/769337 | |
| DATED | : August 16, 2005 | |
| INVENTOR(S) | : Manuel Cabanas-Holmen et al. | |

It is certified that error appears in the above-identified patent and that said Letters Patent is hereby corrected as shown below:

In column 8, line 52, in Claim 1, delete "transfer third" and insert -- third transfer --, therefor.

Signed and Sealed this

Eleventh Day of August, 2009

David J. Kappos
*Director of the United States Patent and Trademark Office*